United States Patent [19]

Sakaida

[11] 4,216,437
[45] Aug. 5, 1980

[54] PROTECTIVE CIRCUITRY FOR PUSH-PULL AMPLIFIERS

[75] Inventor: Kaku Sakaida, Tokyo, Japan
[73] Assignee: Trio Kabushiki Kaisha, Tokyo, Japan
[21] Appl. No.: 950,457
[22] Filed: Oct. 11, 1978

[30] Foreign Application Priority Data

Oct. 14, 1977 [JP] Japan .................................. 52/123207
Oct. 20, 1977 [JP] Japan .................................. 52/126146
Jul. 18, 1978 [JP] Japan .................................. 53/87278

[51] Int. Cl.² .................................................. H03F 3/21
[52] U.S. Cl. ........................................ 330/298; 330/263
[58] Field of Search .................... 330/207 P, 298, 263; 361/85

[56] References Cited

U.S. PATENT DOCUMENTS 3,681,659  8/1972  Suzuki .......................... 330/207 P X
3,904,979  9/1975  Suzuki .............................. 330/207 P Primary Examiner—James B. Mullins
Attorney, Agent, or Firm—Gerald J. Ferguson, Jr.; Joseph J. Baker

[57] ABSTRACT

Circuitry for protecting the output transistors in a double power source, single ended, push-pull amplifier when a reactive load is employed, the load is short circuited, the transistors are overdriven, etc. Various embodiments are described for effecting the foregoing.

12 Claims, 17 Drawing Figures

U.S. Patent  Aug. 5, 1980  4,216,437
FIG. 1
(PRIOR ART)
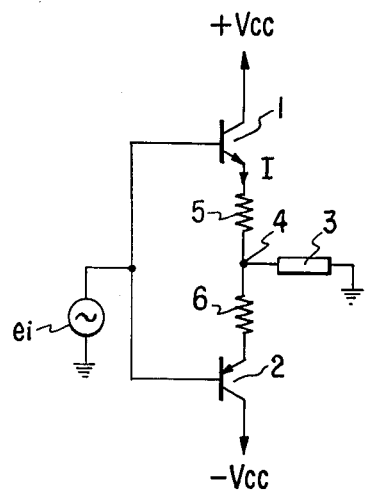
FIG. 2
(PRIOR ART)
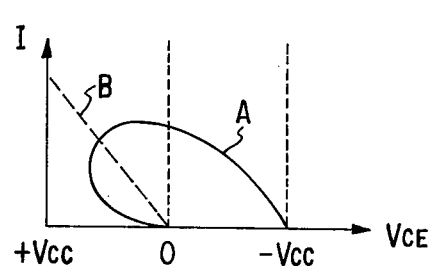
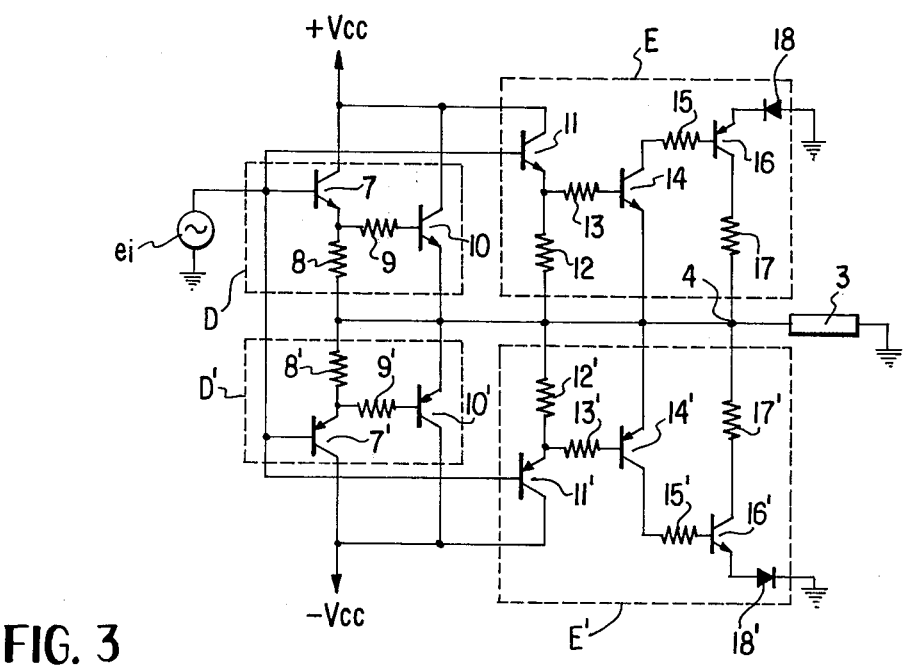
FIG. 3

FIG. 4
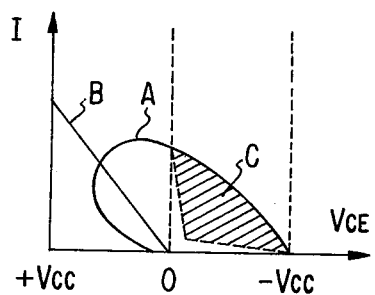
FIG. 5
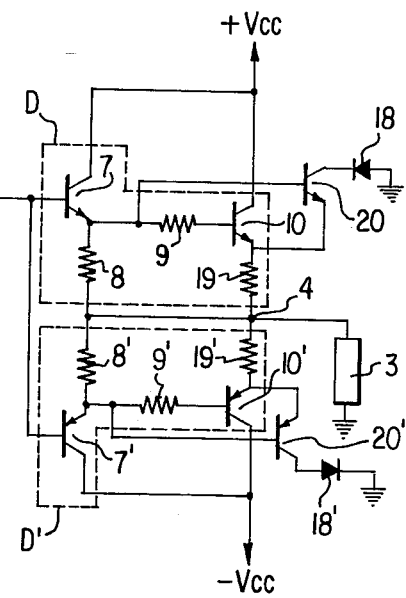
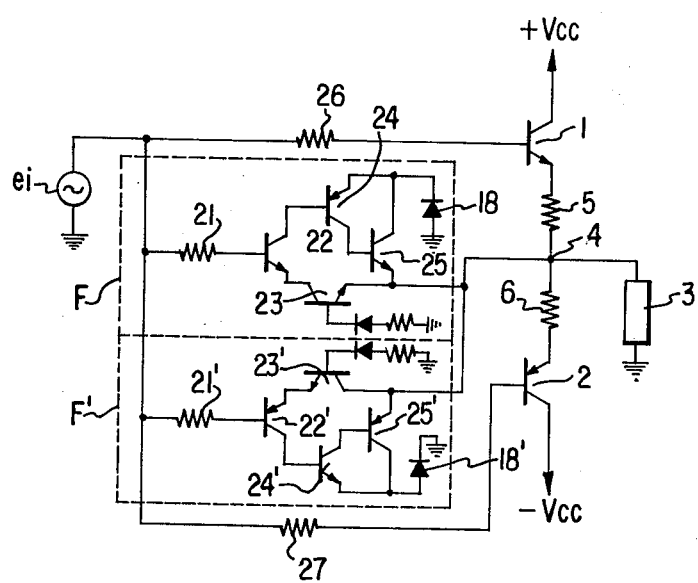
FIG. 6

FIG. 14
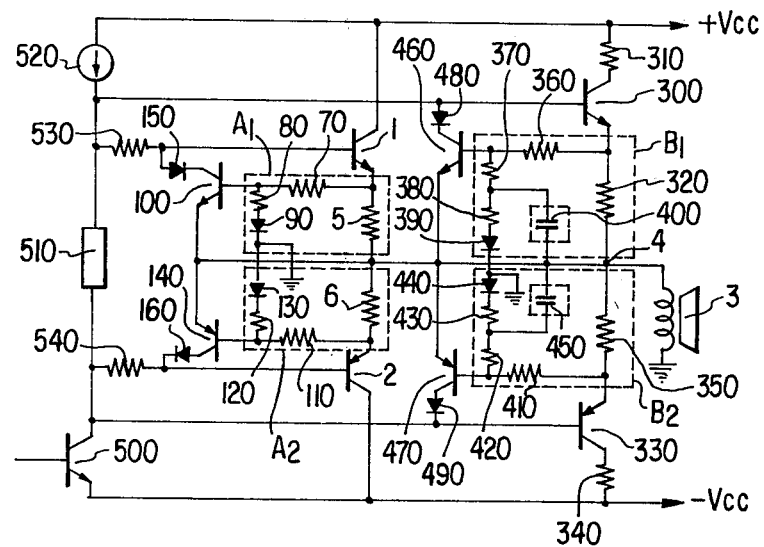
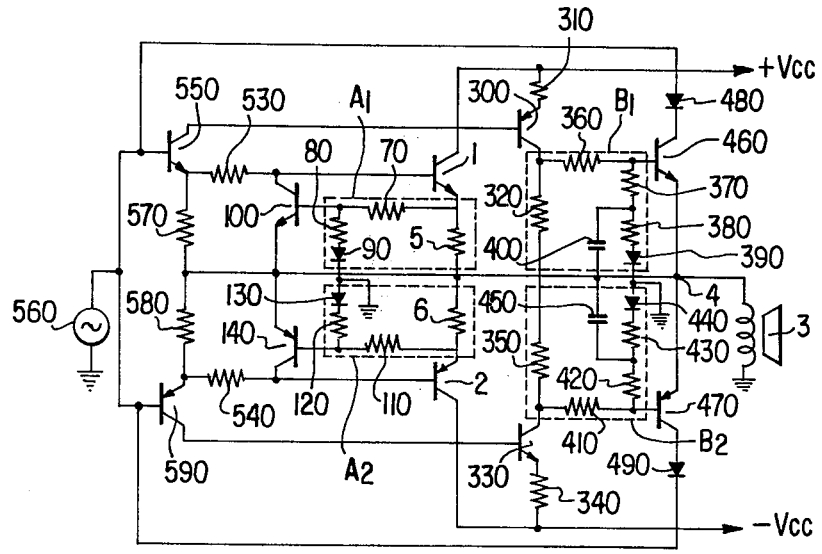
FIG. 15

PROTECTIVE CIRCUITRY FOR PUSH-PULL AMPLIFIERS

BACKGROUND OF THE INVENTION

1. Field of the Invention

This invention relates to transistor amplifier output circuits and, in particular to protective circuitry which ensures safe operation of the output transistors of a transistor amplifier which has a reactive load.

2. Description of the Prior Art

In general, the output stage of double power source, class B, single ended push-pull amplifiers (hereinafter class B SEPP amplifier) is as typically shown in FIG. 1 where an NPN output transistor 1 and a PNP output transistor 2 are connected in series with emitter resistances 5 and 6 respectively between two power sources +Vcc and −Vcc. A load 3 is connected between ground and a common output terminal 4 of the emitters of output transistors 1 and 2. ei is the input signal source.

If load 3 is a reactive, a phase difference develops between the current I flowing into transistor 1 and the load voltage across load 3. For example, current I flows into transistor 1 when the electric potential of common output terminal 4 oscillates up to power source −Vcc. The actuation locus of output transistor 1 when a reactive load is connected as load 3 is described by an elliptical locus with a portion omitted as in the case of the solid line A in FIG. 2 where the horizontal axis is the voltage $V_{CE}$ of the emitter-collector of the transistor and the vertical axis is the emitter current I. The actuation locus of output transistor 1 would be a straight line, such as the broken line B in FIG. 2, when pure resistance is connected as load 3. This relation is identical for output transistor 2.

When a reactive load is connected as load 3, there is a danger of destruction if transistors with large regions of safe operation are not used as output transistors 1 and 2. Moreover, the transistors will cease to circulate output current as the voltage approaches the amount of voltage which the transistors themselves can withstand.

SUMMARY OF THE INVENTION

Primary objectives of this invention are to provide an output circuit for a transistor amplifier having a reactive load which can ensure safe actuation of the output transistors thereof and which would be compatible with a reactance load.

A further primary objective of this invention is to provide an output circuit for a transistor amplifier of the above type in which the distortion characteristics of the transistor amplifier are improved in regions of high input signal frequency.

Other objects and advantages of this invention will be apparent from a reading of the following specification and claims taken with the drawing.

BRIEF DESCRIPTION OF THE DRAWING

FIG. 1 is a circuit diagram of the output circuit of a conventional class B, SEPP amplifier.

FIG. 2 is the actuation locus of the output transistor of the circuit of FIG. 1.

FIG. 3 is a circuit diagram of an illustrative output circuit of a transistor amplifier in accordance with a first embodiment of this invention.

FIG. 4 is the actuation locus of the output transistor of the circuit shown in FIG. 3.

FIG. 5 is a circuit diagram of an illustrative output circuit of a transistor amplifier in accordance with a second embodiment of this invention.

FIG. 6 is a circuit diagram of an illustrative output circuit of a transistor amplifier in accordance with a third embodiment of this invention.

FIG. 14 is a circuit diagram of a further illustrative embodiment of a transistor amplifier protective device in accordance with this invention.

FIG. 15 is a circuit diagram of a further illustrative embodiment of a transistor amplifier protective device in accordance with this invention.

DETAILED DESCRIPTION OF PREFERRED EMBODIMENTS OF THE INVENTION

Figure 7:
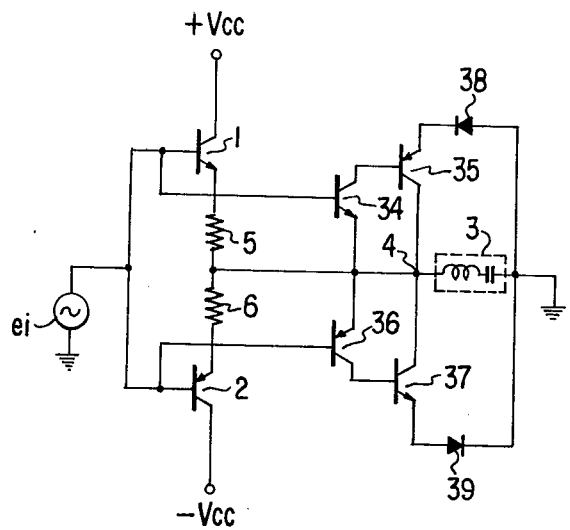
FIG. 7 is a circuit diagram of a modification of the embodiment of FIG. 3.

Reference should be made to the drawing where like reference numerals refer to like parts.

FIG. 3 is a circuit diagram of an illustrative output circuit of a transistor amplifier in accordance with a first embodiment of this invention.

As FIG. 3 illustrates, the circuitry is symmetrical around a median line between power source +Vcc and power source −Vcc. The following description will be directed to the circuitry between power source +Vcc and the central line.

In FIG. 3, a driving transistor 7 and an output transistor 10 are connected through a Darlington circuit, and the class B, SEPP amplifier is formed, producing output in load 3 as an emitter follower. Driving transistor 7 and transistor 11, with which it is connected in parallel, comprise an emitter follower. The output of transistor 11 is applied to the base of a transistor 14 of an amplification circuit comprising transistors 14 and 16 which are directly connected. The collector of transistor 16 is connected to common output terminal 4 through a resistance 17. The emitter of transistor 16 is grounded through a diode 18 which is connected so that the forward direction coincides with the forward direction of the emitter-base of transistor 16. Load 3 is connected between ground and common output terminal 4.

In the circuit of FIG. 3, when a pure resistance is connected as load 3, the current flowing through the collectors of transistors 7 and 10 is the same phase as the load voltage. The amplification circuit D shown in phantom line, in which transistors 7 and 10 are connected via the Darlington circuit, is actuated by input of a positive semi-cycle. It does not operate on input of the negative semi-cycle. In this case, in the amplification circuit E comprising transistors 11, 14 and 16, transistor 11 operates similarly to transistors 7 and 10 due to the emitter follower, but transistors 14 and 16 do not operate due to the absence of a voltage supply to supply operational voltage between the collectors and emitters thereof. Thus, the output circuit shown in FIG. 3 operates identically to the output circuit of a conventional class B, SEPP amplifier.

Next, when load 3 is a reactance load, for example, a capacitive load, transistors 7 and 10 effect conduction, and collector current flows. As stated above, there are periods of amplification even in the region where the electric potential of common output terminal 4 is negative. Moreover, transistor 11 also effects conduction, resulting in amplification. In this case, transistors 14 and 16 carry out amplification since the load voltage, passing from ground through diode 18, is imposed as a supply voltage. The collector current, passing through ground and diode 18, is circulated.

Here, the current flowing from amplification circuit D to load 3 and the current flowing from amplification circuit E to load 3 are determined by the ratio of $hfe_1$, the current amplification rate of amplification circuit D, to $hfe_2$, the current amplification rate of amplification circuit E. If the current amplification rate ratios are such that $hfe_2 > hfe_1$, the current is concentrated in amplification circuit E.

FIG. 4 illustrates this state in conjunction with the actuation locus of output transistor 10. The section C shown by slanted lines in FIG. 4 is the flow in amplification circuit E. Curve A is the actuation locus of transistor 10 when load 3 is a reactance load in the absence of amplification circuit E. The line B illustrates the actuation locus when the load is pure resistance. Thus, by the addition of amplification circuit E, the slanted line section C of the output transistor 10 actuation locus is removed by amplification circuit E and safe actuation of output transistor 10 is ensured.

Since the actuation voltage of transistor 14 and 16 is supplied from the common ground electric potential, transistors 14 and 16 may have small losses. Resistance 17 is incorporated to reduce the collector loss of transistor 16 even further although it may be omitted. If load 3 short-circuits, the electric potentials of the collector and emitter of transistor 16 become ground potential; current does not flow in transistors 14 and 16 and thus, a protective circuit for transistors 14 and 16 is unnecessary. Diode 18 prevents inverse currents. Although the foregoing explanation is directed to the circuit between power source +Vcc and the median line, it also applied to the circuit between power source −Vcc and the median line, when current flows in output transistor 10' due to a phase shift in the region where common output terminal 4 is positive so that circuit E' operates.

FIG. 5 is a circuit diagram of an illustrative transistor amplifier output circuit in accordance with a second embodiment of this invention.

As FIG. 5 illustrates, the structure is symmetrically divided along the median line between the +Vcc power source side and the −Vcc power source side. Since the actuation is similar on both sides, the following description will be directed to the circuit between the +Vcc power source side and the median line.

In FIG. 5, driving transistor 7 and output transistor 10 are connected via a Darlington circuit, forming a class B, SEPP amplifier which produces output in load 3 connected between ground and common output terminal 4 as an emitter follower. The base of transistor 20 is connected to the emitter of driving transistor 7, and the input is the same input as that of output transistor 10. The emitter is connected in common with the emitter of output transistor 10 and its output is into load 3 via resistance 19. The collector is grounded through diode 18 which is connected so that its forward direction is the same as that of the emitter-base of transistor 20.

The operation of the circuit shown in FIG. 5 is identical to that of the embodiment of FIG. 3. Specifically, when the load 3 is pure resistance, transistor 20 does not operate since power is not supplied. The amplification circuit D composed of transistors 7 and 10 operates on positive semi-cycle input, but does not operate on negative semi-cycle input. Operation is identical to that of the output circuit of the conventional, class B, SEPP amplifier.

When load 3 is reactance load, for example, a capacitive load, transistors 7 and 10 conduct even in the region where the electric potential of common output terminal 4 is negative. Collector current thus flows and amplification is effected. The common ground electric potential, passing from ground through diode 18, is imposed on the collector of transitor 20. Collector current flows and amplification is effected. The current flowing from amplification circuit D to load 3 and the current flowing from transistor 20 to load 3 are determined by the ratio of the current amplification rate of amplification circuit D, $hfe_1$, to the current amplification rate of transistor 20, $hfe_2$. If the current amplification rates are so selected that $hfe_1 < hfe_3$, current is mainly in transistor 20.

The region C shown by slanted lines in FIG. 4 corresponds to current flow in transistor 20. As a result, safe operation of output transistor 10 is ensured. The fact that transistor 20 may be one in which the collector loss is small is identical to the case of FIG. 3. If load 3 is short-circuited, current does not flow in transistor 20 and thus, a protective circuit is unnecessary.

FIG. 6 is a circuit diagram of an illustrative transistor amplifier output circuit in accordance with a third embodiment of this invention. As FIG. 6 illustrates, the circuit is symmetrically divided along a median line between the +Vcc power source side and the −Vcc power source side. Since the actuation is identical on both sides, the following description will be directed to the circuit between the +Vcc power source side and the median line.

In FIG. 6, NPN output transistor 1 and PNP output transistor 2 between the +Vcc power source and −Vcc power source are connected in series. Load 3 is connected between ground and common output terminal 4 of the emitters of output transistors 1 and 2, forming a class B, SEPP amplifier output circuit.

The base of transistor 22 receives the input from input signal source ei to the output circuit of the class B, SEPP amplifier. The emitter is connected to the common output terminal 4 through transistor 23. The base of transistor 23 is grounded via a diode. The collector of transistor 21 is connected to the base of transistor 24 of transistors 25 and 24 which are connected via a Darlington circuit. The emitter of transistor 25 is connected to the common output terminal 4 and the collector of transistor 25 is grounded through diode 18 which is connected in the same forward direction as the forward direction between the base and emitter of transistor 24. The amplification circuit F is thus formed, receiving the input of input signal source ei via transistors 22, 23, 24, 25, using the load voltage as a supply voltage and directing its output to load 3.

In the circuit of FIG. 6, when load 3 is pure resistance, the output transistor 1 operates on input of positive semi-cycle. The emitter current of output transistor 1 and the voltage of load 3 are of identical phase. Transistor 23 is in the OFF state and the amplifier circuit F, comprising transistors 22, 23, 24 and 25 does not operate.

When load 3 is a reactance load, for example, a capacitive load, output transistor 1 conducts even in the region where the electric potential of common output terminal 4 is negative. Collector current flows and amplification occurs. Transistor 23 is in the ON state, resulting in conduction by transistors 22, 24 and 25. Amplification is thus effected. The current flowing from amplification circuit F to load 3 and the current flowing from output transistor 1 to load 3 are determined by the ratio of the current amplification rate of amplification circuit F, hfe$_4$, to the current amplification rate of output transistor 1, hfe$_5$. If the current amplification rate is hfe$_4$>hfe$_5$, current is mainly in amplification circuit F. The region shown by oblique lines in FIG. 4, which illustrates the foregoing state in conjunction with the actuation locus of output transistor 1, corresponds to the current flow in amplification circuit F. This signifies that safe actuation of output transistor 1 is ensured. The facts that the transistors used in amplification circuit F may be those with small collector loss and that a protective circuit is unnecessary are identical to the embodiments of FIGS. 1 and 2.

Transistor 23 operates as a diode between the base and emitter of transistor 22 when the common output terminal 4 is positive since there is no collector voltage for transistor 22. Accordingly, when the emitter of transistor 23 is connected directly to common terminal 4, input distortion results. The circuit connections of FIG. 6 prevent such distortion.

Thus, the embodiments of FIGS. 1-3 may be characterized as output circuits of a transistor amplifier comprising a class B, SEPP circuit, the output circuit including a further amplification circuitry having an input identical to that of the output transistor of the output circuit, the output of the further amplification circuitry being applied to the load which is common with the output transistor. The further amplification circuit effects amplification only during the development of a phase difference between the output voltage and the output current in the common output terminal of the transistor amplifier, in order to limit the actuation range of the output transistors and to protect them from destruction because of phase rotation due to the reactance portion of a reactive load and where the power source for the transistor amplifier need not be increased.

As shown in FIG. 7, which is a modification of the embodiment of FIG. 3, a first further amplification circiut comprising diode 38 and transistors 34 and 35 are connected in inverted Darlington fashion in the SEPP circuit whose output is into load 3. The circuit also employs a second further amplification circuit comprising diode 39 and transistors 36 and 37 also connected in inverted Darlington fashion. The input is the same input voltage as that for output transistors 1 and 2. The connections result in output into load 3. +Vcc and −Vcc are the positive and negative power sources.

In the circuit of FIG. 7, when pure resistance is connected as load 3, there is no phase difference between the current flowing in output transistor 1 and the output voltage of load 3. The output transistor 1 functions during the period of positive input voltage. There is bias in the forward direction between the base and emitter of transistor 14, but the first output circuit does not function due to the absence of a power source to supply actuation voltage between the collector and emitter of transistor 15. Moreover, the output transistor 2 functions during the period of negative input voltage, but the second further amplification circuit similarly does not effect amplification. The transistor amplifier shown in FIG. 7 thus operates identically to the output circuit of FIG. 1 when a pure resistance load is employed.

When a reactive load is connected as load 3, a phase difference develops between the collector current which flows in output transistor 1 and the voltage of common output terminal 4. Even in the region in which the electric potential of the common output terminal 4 is negative, there are periods in which collector current flows in output transistor 1 because of the reactance of load 3. In this case, in the first further amplification circuit, voltage imposed on load 3 is supplied between the collector and emitter of transistor 35. Due to a bias in the forward direction between the base and emitter of transistor 34, the first further amplification circuit effects amplification.

Here, assuming hfe$_1$ is the current amplification rate of the output circuit including output transistor 1 and assuming hfe$_2$ is the current amplification rate of the first further amplification circuit, the ratio between the current flowing into load 3 from output transistor 1 and the current flowing into load 3 from the first further amplification circuit is determined by the ratio of current amplification rates hfe$_1$ and hfe$_2$. Selection of a current amplification rate ratio of hfe$_1$<hfe$_2$ results in load 3 being supplied with current mainly from the first further amplification circuit. Moreover, the same relation as that between the first further amplification circuit and output transistor 1 would also apply between output transistor 2 and the second further amplification circuit.

Accordingly, the collector current of output transistors 1 and 2 can be reduced by the first and second amplification circuits which effect amplification only when a phase difference develops between the output voltage and the output current of the common output terminal. The amplification circuits have an input voltage identical to that of output transistors 1 and 2 while their outputs are into common load 3. The output transistor would be protected from destruction, ensuring its safe actuation.

However, the output circuit of the transistor amplifier prevents destruction of the output transistors due to a phase difference between the output voltage and the output current at common output terminal 4, specifically due to phase rotation, especially in regions of input voltage of low frequency (hereinafter low frequency range). Amplification by the further amplification circuits need not occur in regions of input voltage of high frequency (hereinafter high frequency range). Moreover, in circuits such as those of FIGS. 3, 5, 6 and 7, the further amplification circuits thereof switch to the functioning state if a phase difference develops between the output current and the output voltage at the common output terminal 4. Switching distortion tends to develop in the high frequency range due to repeated actuation and non-actuation of the further amplification circuits in the high frequency range. This undesirably affects the distortion characteristics of the output circuit of the transistor amplifier.

Figure 8:
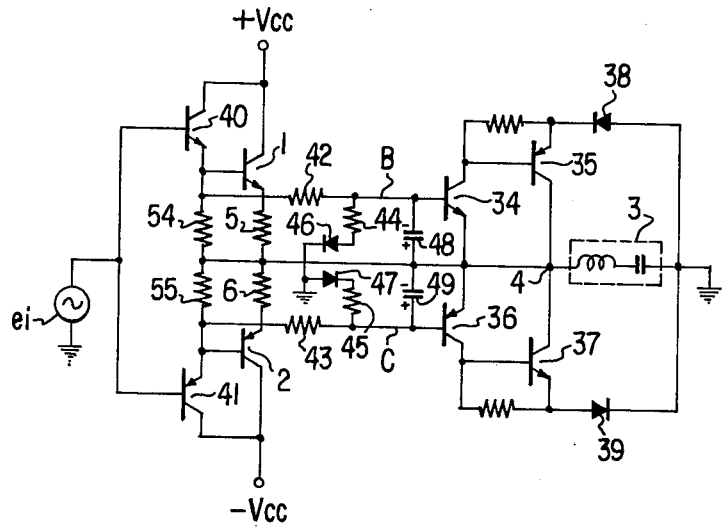
FIG. 8 is a circuit diagram of an illustrative fourth embodiment of the invention.
Figure 9:
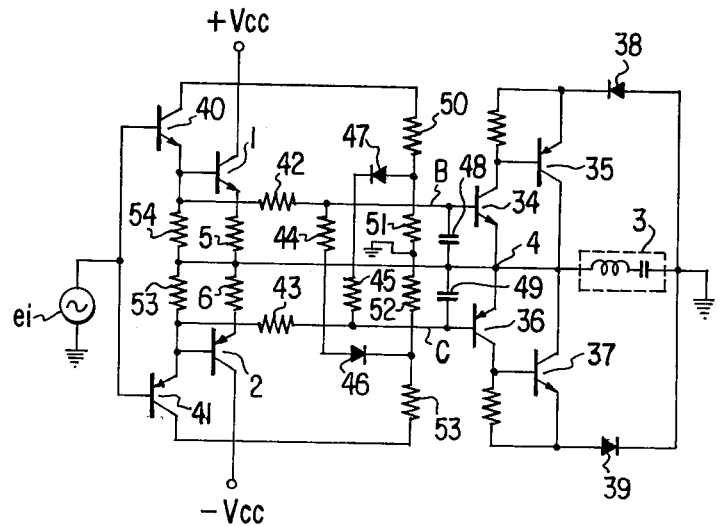
FIG. 9 is a circuit diagram of an illustrative fifth embodiment of the invention.

Accordingly, in the embodiments of FIGS. 8 and 9, a time constant circuit is connected to the input terminal of the further amplification circuitry. The time constant during charging and discharging of the time constant circuit is set at a value lower than the frequency at which the output transistor is destroyed by phase rotation due to load reactance. During input of an input signal with a frequency higher than the frequency corresponding to the time constant established above, the amplification action of the further amplification circuit is halted.

In FIG. 8, 40 and 41 are transistors connected in Darlington fashion to output transistors 1 and 2 respectively. They comprise the driving stage of output transistors 1 and 2. 54 and 55 are emitter resistances which are connected between common output terminal 4 and the emitters of transistors 40 and 41. $e_i$ illustrates the input signal source.

The first further amplification circuit comprising transistors 34, 35 and diode 38 and the second further amplification circuit comprising transistors 36, 37 and diode 39 are supplied actuation voltage by the electric potential of common output terminal 4 when a phase difference exists between the output current and the output voltage at the common output terminal. The input voltages of output transistors 1 and 2 are applied to transistors 4 and 5 respectively passing through resistances 42 and 43. The output is into load 3.

A condenser 48 is connected between the base of transistor 34 and common output terminal 4 while a series circuit of resistance 44 and diode 46 is connected between the base of transistor 34 and ground. Moreover, a condenser 49 is connected between the base of transistor 36 and common output terminal 4 while a series circuit of diode 47 and resistance 45 is connected between ground and transistor 36.

When there is no phase difference between the output voltage and the output current at common output terminal 4, resistances 42 and 44 are so selected that the electric potential at the base of transistor 34, specifically at point B, is lower than the potential at common output terminal 4 during positive input voltage. During negative input voltage, resistances 43 and 45 are so selected that the electric potential at the base of transistor 36, specifically at point C, is higher than the potential of common output terminal 4. Accordingly, condenser 48 is charged with the polarity shown in FIG. 8, specifically with a (−) potential on the B side of condenser 18 and with (+) potential on the common terminal 4 side. Condenser 49 is charged as shown in FIG. 8, with a (−) potential on the common terminal side of condenser 49 and with a (+) potential on the C side. Transistors 34 and 36 are biased in the opposite direction and cut off.

The path of charging of condenser 48 in this case is the path from condenser 48, resistance 44, diode 46 to ground. The path of discharging is primarily from condenser 48, the emitter resistance 54 through resistance 42. The path of charging of condenser 49 is the path of common output terminal 4 from ground, diode 47, resistance 45 and condenser 49 while the path of discharge is primarily the route of emitter resistance 55 from condenser 49 and resistance 43.

Thus, the time constant of the time constant circuit comprising the charge-discharge paths given above is so set that it is smaller than the time constant corresponding to the frequency $f_D$ at which the output transistors 1 and 2 are destroyed by phase rotation due to reactance of load 3. The relation between frequency $f_D$ and frequency $f_T$ corresponding to this established time constant would be $f_T > f_D$.

First, in the absence of phase difference between output voltage and output current at common output terminal 4, transistors 34 and 36 have opposite bias and switch OFF. The first and second further amplification circuits do not function. The actuation is identical to that of the circuitry of FIG. 1.

Next, when a phase difference exists between the output voltage and the output current at common output termninal 4 and when the frequency of the input signal is below the frequency $f_T$, the potential of common output terminal 4 becomes (−) during the period of positive input signals. The potential of point B becomes higher than the potential of common output terminal 4. The condenser 18 is charged through the main discharge path noted before in opposite polarity from the polarity shown in FIG. 8. Forward bias develops between the base and emitter of transistor 34. Actuation voltage is supplied to the emitter-collector of transitor 35 by the potential of common output terminal 4 and the first further amplification circuit effects amplification. Accordingly, the collector current of output transistor 1 is borne by the first further amplification circuit and safe actuation of output transistor 1 is ensured. Moreover, the relation between output transistor 2 and the second further amplification circuit is identical to that described above.

Next, when a phase difference exists between the output voltage and the output current at the common output terminal 4 and the input signal frequency exceeds the frequency $f_T$, transistors 34 and 35, 36 and 37 are biased in reverse directions and the first and second further amplification circuits do not amplify because they are OFF. Accordingly, when the input signal frequency exceeds the frequency $f_T$, switching distortion does not develop since the first and second further amplification circuits are usually OFF.

FIG. 9 is a circuit diagram of a further illustrative embodiment of this invention. In the output circuits of the transistor amplifier of the circuitry of FIG. 8, resistances 50 and 51 are connected in a series circuit between ground and (+) power source +Vcc. The anode of diode 47 is connected at the common connection point of resistances 50 and 51. A series circuit of resistances 52 and 53 is connected between ground and (−) power source −Vcc. The cathode of diode 46 is connected to the common connection point of resistances 52 and 53. In comparison to the circuitry of FIG. 8, the negative polarity of the diode shifts in the direction of negative potential while the positive polarity of the diode 47 shifts in the direction of positive polarity with direct current. In the absence of a phase difference between the output voltage and the output current at common output terminal 4, the potential at point B is set lower than the potential of common output terminal 4 while the potential of point C is set at a potential higher than the potential of common output terminal 4. Moreover, the establishment of the time constants for the charge-discharge paths of condensers 48 and 49 are identical to that for the case of the FIG. 8 circuitry. Thus, the action of this embodiment is not described in detail since it is identical to that of the FIG. 8 circuitry. As described above, destruction of the output transistor in the output circuit of the transistor amplifier by phase rotation due to a reactance load is completely eliminated and its safe actuation is ensured. The embodiment of FIGS. 8 and 9 eliminate virtually all distortion.

Other embodiments of the invention are described hereinafter with respect to FIGS. 11-14 where FIGS.

10 and 11 are prior art embodiments relating thereto. Generally, in transistor amplifiers, collector loss which exceeds the rated value of the output transistors of said transistor amplifiers occurs during reduction of the load impedance, short-circuiting or excessive input subjecting the output transistors to irreversible damage. Various protective devices are employed to prevent the destruction of the output transistors such as those of FIGS. 10 and 11 which are circuit diagrams of protective devices for transistor amplifiers.

Figure 10:
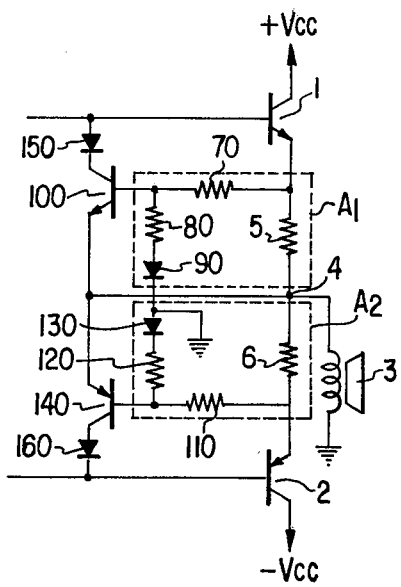
FIGS. 10 and 11 are circuit diagrams of conventional protective circuitry for transistor amplifiers.

In the circuit diagram of FIG. 10, 1 and 2 are the No. 1 output transistors. Resistance 5 is connected between the emitter of the No. 1 output transistor 1 and common load terminal 4 while resistance 6 is connected between the emitter of the No. 1 output transistor 2 and common load terminal 4. Power sources +Vcc and −Vcc are connected respectively to the collectors of No. 1 output transistors 1 and 2. Load 3 is connected to common load terminal 4. The positive and negative cycles of the input voltage are respectively amplified by No. 1 output transistors 1 and 2. This is the circuitry of the class B, SEPP amplifier.

Protection of No. 1 output transistor 1 is effected by a No. 1 bridge circuit $A_1$ comprising resistance 5, load 3 and a series circuit of resistances 70, 80 and diode 130. The emitter of No. 1 protective transistor 100 is connected to the common load terminal 4 and the collector is connected to the base of the No. 1 output transistor 1 through diode 150. An unbalance is detected in the No. 1 bridge circuit $A_1$ by transistor 100. When the collector loss of No. 1 output transistor 1 is amplified above a normal value, the No. 1 protective transistor 100 switches to ON, the output of the No. 1 output transistor 1 is restricted to effect protection thereof. Moreover, protection of No. 1 output transistor 2 is effected similarly by a No. 1 bridge circuit $A_2$ composed of resistance 6, load 3 and a series circuit of resistances 110, 120 and diode 130. An unbalance of the No. 1 bridge circuit $A_2$ is detected by No. 1 protective transistor 140 and No. 1 protective transistor 140 switches to ON when load 3 decreases beyond an established value.

Figure 12:
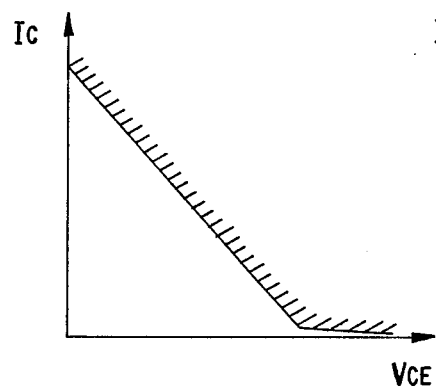
FIGS. 12 and 13 are graphs which explain the functions of the conventional protective circuits of FIGS. 10 and 11.

The range of protection of the protection device of FIG. 10 would be shown by a virtually straight line as in FIG. 12, which illustrates this for the No. 1 output transistor 1 where the voltage $V_{CE}$ between the collector and emitter of No. 1 output transistor 1 is the horizontal axis and collector current Ic is the vertical axis. The range exhibited by the slanted line portion, specifically the outer side of the straight load line, is the protection range.

Figure 13:
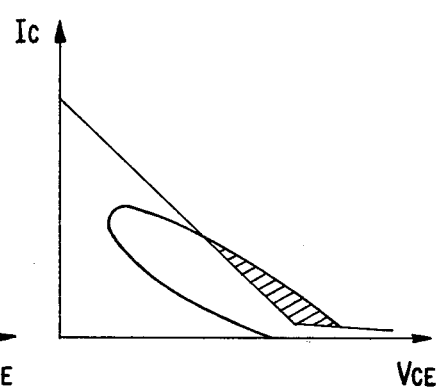

However, when load 3 is not a pure resistance, a phase difference develops between the voltage produced in load 3 and the current flowing in resistance 5. The load line of No. 1 output transistor 1 would then be an elliptical locus as shown in FIG. 13. This fact indicates that when load 3 is not a pure resistance, the protective device would be actuated, detecting load 3 as if it had decreased, even if it were a normal value, thereby restricting the input of No. 1 output transistor 1. This state occurs in the region illustrated by the slanted line portion of FIG. 13. Thus, the slanted line portion is lost from the amplifier output and extreme distortion develops. This defect also develops in No. 1 output transistor 2.

Figure 11:
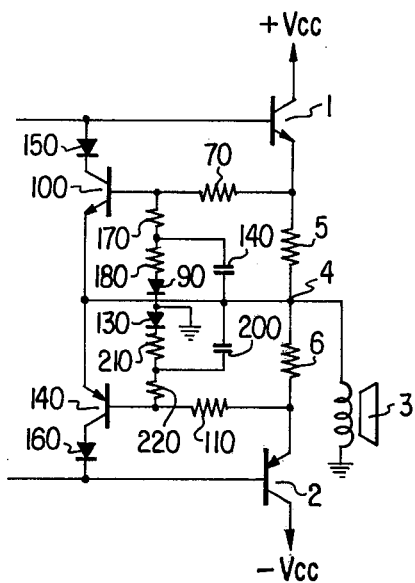

For this reason, the series circuits of resistances 170 and 180 and of resistances 210 and 220 are connected as shown in FIG. 11, instead of resistances 80 and 120 respectively of the protective device shown in FIG. 10. The protective device also has a condenser 190 connected between the common connection point of resistances 170 and 180 and common load terminal 4. It also has a condenser 200 connected between the common connection point of resistances 210 and 220 and common load terminal 4. In the protective device of FIG. 11, condensers 190 and 200 are so charged that No. 1 protective transistors 100 and 140 are in inverse bias when the impedance value of load 3 is normal. Thus, No. 1 protective transistors 100 and 140 do not switch to ON in response to instantaneous fluctuations in voltage which develop in resistances 5 and 6. However, even though No. 1 output transistors 1 and 2 are operating at a level which should be protected, No. 1 output transistors 1 and 2 operate beyond the safe range since the switching of the No. 1 protective transistors 100 and 140 to ON is delayed. There is thus a great possibility of destruction and cases of insufficient protection can occur with the protective device shown in FIG. 11.

FIG. 14 is a circuit diagram of an illustrative transistor amplifier protective device in accordance with this invention, which overcomes the problems associated with the circuits of FIGS. 10 and 11. In FIG. 14, 1 and 2 are the No. 1 output transistors. Resistance 5 is connected between the emitter of No. 1 output transistor 1 and common load terminal 4 while resistance 6 is connected between the emitter of No. 1 output transistor 2 and common load terminal 4. Load 3 is connected to the common load terminal 4. The driving stage of the output stage comprises a driving stage transistor 500, a bias circuit 510 for No. 1 output transistors 1 and 2 and a constant current source 52 as for driving stage transistor 500.

The protective circuit of the No. 1 output transistor 1 comprises No. 1 bridge circuit $A_1$, whose arms are the series circuit of resistance 5, load 3, resistance 70, resistance 80 and diode 90 where the emitter of the No. 1 output transistor is grounded through the series circuit of resistance 80 and diode 90. The base of No. 1 protective transistor 100 is connected at the common connection point of resistances 70 and 80, the emitter is connected at the common load terminal 4, and the collector is connected to the base of the No. 1 output transistor 1 through diode 150. Unbalance of No. 1 bridge circuit $A_1$ would be detected, which would switch on the No. 1 protective transistor 100. Thus, the input of No. 1 output transistor 1 would be restricted at that time.

Similarly, the No. 1 bridge circuit $A_2$ comprises a series circuit of resistance 6, load 3, resistance 110, resistance 120 and diode 130 where the emitter of No. 1 output transistor 2 is grounded through resistance 110, resistance 120 and diode 130. The No. 1 protective transistor 140 detects imbalance of No. 1 bridge circuit $A_2$ and restricts the input of the No. 1 output transistor 2.

300 and 330 are No. 2 output transistors. Resistance 320 is connected between the emitter of No. 2 output transistor 300 and common load terminal 4, while collector load resistance 310 is connected between the collector and the power source +Vcc. These are connected in parallel so as to conduct amplification with No. 1 output transistor 1. Resistance 350 is connected between the emitter of No. 2 output transistor 330 and common load terminal 4 while collector load resistance 340 is connected between the collector and power source −Vcc. These are connected in parallel so as to conduct amplification with No. 1 output transistor 2.

The protective circuit of No. 2 output transistor 300 is composed of No. 2 bridge circuit $B_1$ and the series circuit of resistance 320, load 3, resistances 360, 370, 380 and a diode 390 where the emitter of output transistor 300 is grounded through resistances 360, 370, 380 and diode 390. The base of No. 2 protective transistor 460 is connected to the common connection point of resistances 360 and 370, the emitter is connected to common load terminal 4 and the collector is connected to the base of No. 2 output transistor 300 through a diode 480. In addition, a condenser 400 is connected between the common connection point of resistances 370 and 380 and common load terminal 4. Thus, unbalance is detected in No. 2 bridge circuit $B_1$ and the No. 2 protective transistor 460 switches on. When this No. 2 protective transistor is on, the input of the No. 2 output transistor 300 is restricted.

Similarly, the protective circuit of No. 2 output transistor 330 is composed of No. 2 bridge circuit $B_2$ with resistance 350, load 3 where the emitter of the No. 2 output transistor 330 is grounded through resistances 410, 420, 430 and a diode 440. A condenser 450 is connected between the common connection point of resistances 420 and 430 and common load terminal 4. A No. 2 protective transistor 470 also detects unbalance in No. 2 bridge circuit $B_2$. When No. 2 protective transistor 470 is switched ON, the input of the No. 2 output transistor 330 is restricted.

In the above circuits, when the impedance of load 3 exceeds the normal value and when the input voltage is below the normal value, the voltage produced at resistances 5 and 6 is reduced and the unbalanced output voltage of No. 1 bridge circuits $A_1$ and $A_2$ cannot actuate the No. 1 protective transistors 100 and 140 to the ON state. Thus, No. 1 protective transistors 100 and 140 are in the OFF state. The voltage produced similarly at resistances 320 and 350 is also small and No. 2 protective transistors 460 and 470 also are in the OFF state. The No. 1 and No. 2 output transistors 1, 300 and 2, 300 amplify the input voltage of the positive and negative cycles in the output of actuating transistor 500. Thus, with output in load 3, actuation of the class B, SEPP amplifier is conducted without restriction of the conventional input.

During reduction of the impedance of load 3, during short-circuiting and during the imposition of excessive input, the emitter current of No. 1 output transistors 1, 2 and of No. 2 output transistors 300, 330 increases above normal values. The collector loss increases and the voltage produced in resistances 5, 6, 320 and 350 increase. As a result, the No. 1 bridge circuits $A_1$, $A_2$ become unbalanced. This unbalanced voltage of No. 1 bridge circuits $A_1$, $A_2$ immediately switches the No. 1 protective transistors 100 and 140 to ON. The input of No. 1 output transistors 1, 2 is thus restricted protecting the No. 1 output transistors 1, 2. The No. 2 output transistors 300, 330 operate primarily due to restriction of the input of No. 1 output transistors 1, 2. Similarly, when load 3 becomes a reactance load, transistors 100, 140 switch to ON, protecting the No. 1 output transistors 1, 2. Since the No. 2 output transistors 300, 330 supplement the deficient sections shown by the slanted line portion in FIG. 13, wave shape distortion does not develop. In this case, safe actuation regions of the No. 2 output transistors 300, 330 are ensured due to the presence of collector load resistances 310, 340.

As described previously, the voltage produced at resistances 320, 350 increases but, due to the presence of condensers 400, 450, when load 3 exceeds the normal value or when the input voltage is below the normal value, the condenser 400 is charged via the path of common load terminal 4, condenser 400, resistance 380 and diode 390. The charged voltage of condenser 400 at this time is so polarized as to reduce the bias of No. 2 protective transistor 46 thereby shutting it off. When impedance of load 3 is reduced, as described above, short-circuited or excessive input voltage develops and the emitter current of No. 2 output transistor 300 becomes greater than the normal value. Resistance 380 is so chosen that its resistance value is greater than the values of resistances 360 or 370. The condenser 400 is charged via the path of resistance 360, resistance 370, condenser 400, and common load terminal 4. The polarity in this case is opposite that of the previous case to thereby switch the No. 2 protective transistor 460 to the ON state. No. 2 protective transistor 460 is maintained in the OFF state until the sum of the voltage produced by resistance 370 and the charging voltage of condenser 400 reaches the forward voltage, at which point the No. 2 protective transistor 460 is switched ON. The protective action of No. 2 output transistor 300 does not work instantly. It is delayed, after which the protective action of No. 2 output transistor 300 begins. Accordingly, in the event of continuing reduction of load 3 impedance, short-circuiting or imposition of excessive input, protection of No. 2 output transistor 300 is effected. Protection of No. 2 output transistor 330 by condenser 450 is also similarly delayed.

Because of the resulting reactance of load 3, even if the input is restricted for the protection of No. 1 output transistors 1, 2, the slanted line portion of FIG. 13 would be compensated by No. 2 output transistors 300, 330 and there would be no output voltage distortion. In the case of shortcircuiting etc., No. 2 output transistors 300, 330 would also escape damage due to collector load resistances 310, 340. When such a state continues, the input of No. 2 output transistors 300, 330 is also restricted by No. 2 protective transistors 460, 470 thereby protecting them. In addition, the level of protection of No. 2 output transistors 300, 330 and the time lag until protection begins can be determined independently of the protection level of No. 1 output transistors 1, 2.

The circuit which protects No. 1 output transistors 1 and 2 by restricting the input of No. 1 output transistors 1 and 2 immediately after the collector loss of No. 1 output transistors exceeds the normal value, is termed the No. 1 protective circuit, while the circuit which protects No. 2 out transistors 300, 330 restricting the input of No. 2 output transistors 300, 330 for a fixed amount of time after the collector loss of the No. 2 output transistors exceeds the normal value, is the termed No. 2 protective circuit.

Next, as a variation of the foregoing embodiment, the safety operation region of No. 2 output transistors 300, 330 can be ensured even if the voltage supply to No. 2 output transistors 300, 330 falls below the voltage supply to No. 1 output transistors 1, 2.

FIG. 15 is a circuit diagram of a further illustrative embodiment of this invention. In FIG. 15, the No. 1 output transistors 1, 2 and the No. 2 output transistors 300, 330 are designed to be operated by the output of the emitters of actuating transistors 550, 590 and of the collectors as input. Resistances 570 and 580 are the emitter load resistances of actuating transistors 550 and 590. 560 is the signal source. Also in the circuit of FIG.

15, the No. 1 protective circuit is connected to No. 1 output transistors 1 and 2 while the No. 2 protective circuit is connected to No. 2 output transistors 300, 330. The actuation is identical to that in the embodiment of FIG. 14. Because of this, a detailed description is omitted. A simplified explanation is as follows. No. 1 output transistors 1, 2 and No. 2 output transistors 300, 330 are actuated by the actuation transistors 550, 590. Resistances 310, 340 are connected in the output current circuits of No. 2 output transistors 300, 330. Even if load 3 short-circuits, the safe actuation region of the No. 2 output transistor would be ensured by the resistances 310, 340. Even if the No. 1 output transistor were to exceed the safe operation region because of reactance in load 3, the No. 1 protective circuit would immediately operate, protecting the No. 1 output transistors 1 and 2. Thus, the deficient region of slanted lines shown in FIG. 13 would be compensated for by No. 2 output transistors 300 and 330. During continuation of short-circuiting of load 3, for example, No. 2 output transistors 300 and 330 would be protected by a delay involving a time constant. Protection of No. 1 output transistors 1 and 2 would be as described above during short-circuiting of load 3. Moreover, instead of resistances 310 and 340, the voltage supply to No. 2 output transistors 300 and 330 may be reduced to a point lower than the supply voltage to No. 1 output transistors 1 and 2 in order to ensure the safe operation region of No. 2 output transistors 300 and 330.

Figure 16:
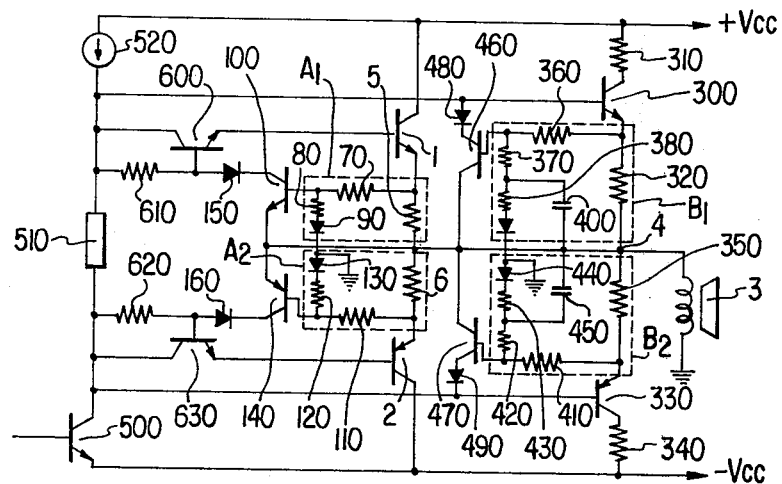
FIG. 16 is a circuit diagram of a further illustrative embodiment of a transistor amplifier protective device in accordance with this invention.

FIG. 16 is a circuit diagram of a further illustrative embodiment of this invention. In FIG. 16, No. 1 output transistors 1 and 2 are actuated through transistors 600 and 630 by actuation transistor 500 in which constant current source 520 acts as a load. No. 2 output transistors 300 and 330 are directly actuated by transistor 500. 510 is the bias circuit for No. 1 output transistors 1, 2 and for No. 2 output transistors 300, 330. Resistances 610, 620 are the bias resistances for transistors 600 and 630. The No. 1 protective circuit is connected to the No. 1 output transistors 1 and 2 while the No. 2 protective circuit is connected to No. 2 output transistors 300 and 330.

The description of the protective operation of the circuit shown in FIG. 16 is also omitted since it is identical to that of the FIG. 14 embodiment. However, in the circuit shown in FIG. 16, during functioning of the No. 1 protective circuit, the emitter-collector resistance of transistors 600 and 630 increases due to the ON state of No. 1 protective transistors 100 and 140. The input of No. 1 output transistors 1 and 2 is restricted, protecting them. The voltage supply to No. 1 output transistors 300, 330 is reduced lower than the value of the voltage supply to No. 1 output transistors 1 and 2 in order to ensure a safe operation region of No. 2 output transistors 300 and 330.

Figure 17:
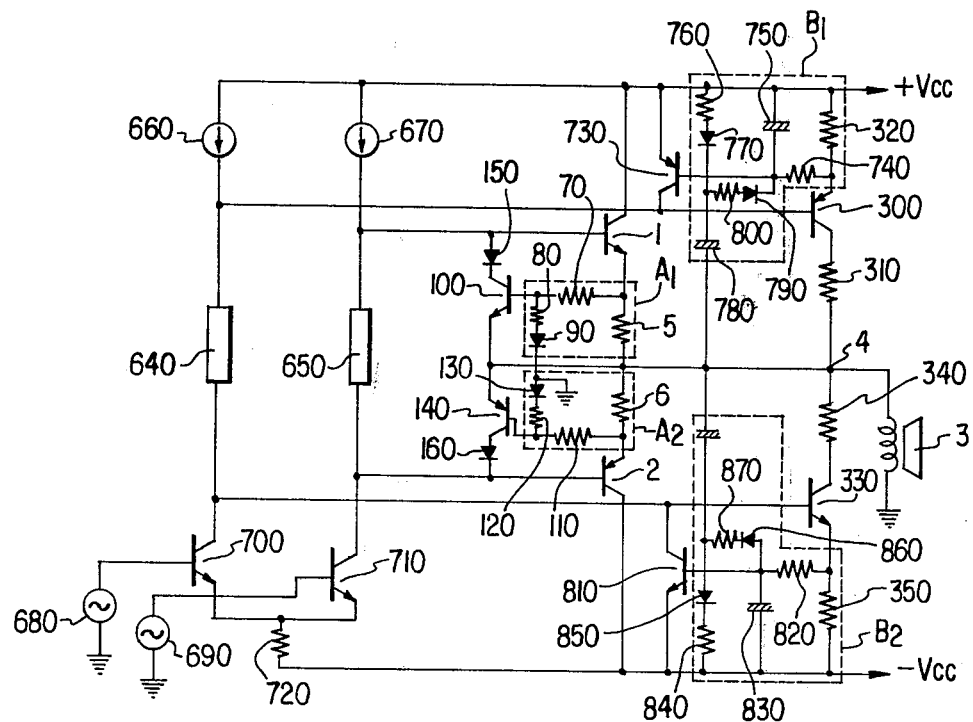
FIG. 17 is a circuit diagram of a further illustrative embodiment of a transistor amplifier protective device in accordance with this invention.

FIG. 17 is a circuit diagram of a further illustrative embodiment of the invention. In the circuit of FIG. 17, the No. 1 output transistors 1 and 2 are actuated by an actuation transistor 710 comprising a difference amplifier which uses a current source 670 as a load while No. 2 output transistors 300 and 330 are actuated by another actuation transistor 700 comprising a difference amplifier which uses a current source 660 as a load. 650 is the bias circuit of No. 1 output transistors 1 and 2 while 640 is the bias circuit of No. 2 output transistors 300 and 330. 720 is a resistance connected to the common emitter of actuation transistors 700 and 710. 680 and 690 are identical input signal sources in which only the phases differs by 180°. No. 1 protective circuit is connected to No. 1 output transistors 1 and 2 while No. 2 protective circuit is connected to No. 2 output transistors 300 and 330.

The No. 2 protective circuit of No. 2 output transistor 300 comprises a bridge circuit of a series circuit of resistances 320, 740, 760 and a diode 770 and a series circuit of resistance 800 and diode 790. A condenser 750 is connected between the power source +Vcc and the common connection point of resistance 740 and diode 790 while a condenser 780 is connected between common load terminal 4 and the common connection point of resistance 800 and diode 770. Conversely, the common connection point of resistance 740 and diode 790 involves connection to the base of No. 2 protective transistor 730 which restricts the input of No. 2 output transistor 300. The protective circuit of No. 2 output transistor 330 is the same as discussed above.

What is claimed is:

1. Protective circuitry for use with a double power source, single ended, push-pull amplifier having first and second output transistors adapted for operation into a common load impedance at a common output terminal, said protective circuitry comprising
   amplifying means including first and second amplifying circuits respectively connected in parallel with said first and second transistors so that the inputs thereof, are respectively connected to the inputs to said first and second transistors and the outputs thereof are also adapted for operation into said common load impedance, said amplifying means including means for rendering the amplifying means operative only when a phase difference occurs between the output voltage and the output current at said common output terminal.

2. Protective circuitry as in claim 1 including first and second time constant means in respective circuit with said first and second amplifying circuits, the time constant of each of which is less than a predetermined value, each said first and second amplifying circuit being rendered inoperative by its associated time constant means in response to the frequency of the input signal to said single ended push-pull amplifier being greater than the frequency corresponding to said predetermined value of the time constant even though a phase difference occurs between said output voltage and current at said common output terminal.

3. Protective circuitry as in claim 2 where said predetermined value of the time constant of each said time constant means corresponds to a value lower than the frequency at which the operation of said output transistors is impaired due to the said phase difference between said output voltage and current at the common output terminal.

4. Protective circuitry as in claim 1 where said common load impedance is connected between said common output terminal and a reference potential and includes a reactive component, said first transistor is a NPN transistor adapted to pass the positive half cycles of the input signal applied thereto, said second transistor is a PNP transistor adapted to pass the negative half cycles of the input signal applied thereto,
   said first amplifying circuits including means for causing itself to carry more current than said first output transistor in response to current flow through the first transistor when said common output terminal is negative with respect to said reference potential to thereby protect said first output transistor when said common output impedance includes said reactive component, and said second amplifying circuit including means for causing itself to carry more current than said second output transistor in response to current flow through the first transistor when said common output terminal is positive with respect to said reference potential to thereby also protect said second output transistor when said common output impedance includes said reactive component.

5. Protective circuitry as in claim 4 where said reference potential is ground.

6. Protective circuitry as in claim 4 where said first amplifying circuit includes a first further transistor in circuit with said reference potential, operating potential for said first further transistor being applied from said reference potential only when said common output terminal is negative with respect to the reference potential.

7. Protective circuitry as in claim 6 where said second amplifying circuit includes a second further transistor in circuit with said reference potential, operating potential for said second further transistor being applied from said reference potential only when said common output terminal is positive with respect to the reference potential.

8. Protective circuitry as in claim 7 where said first and second further transistors each have one terminal thereof connected to said reference potential, another terminal thereof connected to said common output terminal and the respective bases thereof connected to said inputs of the first and second output transistors.

9. Protective circuitry for use with a double power source, single ended, push-pull amplifier having first and second output transistors adapted for operation into a common output load impedance, said protective circuitry comprising first protective circuitry responsive to the magnitude of said load impedance to reduce the current through said first and second output transistors when the current therethrough exceeds a first predetermined value; and third and fourth output transistors respectively in parallel circuit with said first and second output transistors, said third and fourth output transistors also adapted for operation into said common load impedance so that said third and fourth output transistors respectively carry the current normally carried by said first and second output transistors in response to said first protective circuitry reducing the current through said first and second output transistors.

10. Protective circuitry as in claim 9 including second protective circuitry responsive to the magnitude of said load impedance to reduce the current through said third and fourth output transistors when the current therethrough exceeds a second predetermined value; and delay means for delaying the operation of said second protective circuitry for a predetermined amount of time after said first protective circuitry reduces the current in said first and second output transistors.

11. Protective circuitry as in claim 9 or 10 where said third and fourth output transistors are respectively in parallel with said first and second output transistors.

12. Protective circuitry as in claim 9 including a first and second voltage supplies respectively for (a) said first and second output transistors and (b) said third and fourth output transistors, the absolute value of said first voltage supply being greater than that of said second voltage supply.

* * * * *